(12) United States Patent
Aude

(10) Patent No.: US 6,469,652 B1
(45) Date of Patent: Oct. 22, 2002

(54) PIPELINED ANALOG-TO-DIGITAL CONVERTER USING ZERO-CROSSING CAPACITOR SWAPPING SCHEME

(75) Inventor: Arlo J. Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/645,972

(22) Filed: Aug. 24, 2000

(51) Int. Cl.[7] ............................. H03M 1/44; H03M 1/14
(52) U.S. Cl. ......................... 341/172; 341/162; 341/161
(58) Field of Search ............................ 341/161, 162, 341/163, 172

(56) References Cited

U.S. PATENT DOCUMENTS

| | | | | |
|---|---|---|---|---|
| 5,001,725 A | * | 3/1991 | Senderowicz | 341/143 |
| 5,594,445 A | * | 1/1997 | Ginetti | 341/162 |
| 5,710,563 A | * | 1/1998 | Vu et al. | 341/161 |
| 5,724,000 A | * | 3/1998 | Quinn | 327/554 |
| 5,764,176 A | * | 6/1998 | Ginetti | 341/161 |

* cited by examiner

Primary Examiner—Howard L. Williams
(74) Attorney, Agent, or Firm—John L. Maxin

(57) ABSTRACT

There is disclosed, for use in an analog to digital (ADC) converter, an ADC stage that receives a differential analog input signal, quantizes the differential analog input signal to a plurality of digital bits, and generates an output residue signal corresponding to a quantization error of the differential analog input signal. The ADC stage comprises: 1) a differential amplifier having an inverting input and a non-inverting input and a differential output comprising an inverting output and a non-inverting output; 2) a first capacitor having a first side and a second side and a second capacitor having a first side and a second side, wherein the second side of the first capacitor is coupled to the second side of the second capacitor and to the inverting input of the differential amplifier; 3) a third capacitor having a first side and a second side and a fourth capacitor having a first side and a second side, wherein the second side of the third capacitor is coupled to the second side of the fourth capacitor and to the non-inverting input of the differential amplifier; 4) a switch matrix for coupling the first sides of the first, second, third and fourth capacitors to selected ones of the first sides of the first, second, third and fourth capacitors, to selected ones of the inverting and non-inverting outputs of the differential amplifiers, and to selected ones of a positive reference voltage and a negative reference voltage; and 5) a switch control logic circuit for detecting a zero reference level crossing, wherein a voltage level on a preceding non-inverting output of a preceding ADC stage transitions from below a voltage level on a preceding inverting output of said preceding ADC stage to a voltage level above said voltage level on said preceding inverting output.

23 Claims, 4 Drawing Sheets

PIPELINED ANALOG-TO-DIGITAL CONVERTER USING ZERO-CROSSING CAPACITOR SWAPPING SCHEME

TECHNICAL FIELD OF THE INVENTION

The present invention is generally directed to analog-to-digital converters (ADCs) and, more specifically, to a zero-crossing capacitor swapping apparatus that improves the differential non-linearity (DNL) and integral non-linearity (INL) characteristics of an ADC.

BACKGROUND OF THE INVENTION

Many low-power, high speed application make use of a pipelined analog-to-digital (A/D) converter (or ADC). Pipelined ADCs provide high data throughput rates, occupy a comparatively small area of an integrated circuit, consume relatively little power, and minimize circuit complexity. Many of these advantages stem from the pipelined arrangement of multiple small A/D conversion stages.

All of the stages work concurrently. The first stage converts the most recent analog sample to a small number of digital bits (e.g., 2 bits) and passes an analog residue signal on to a subsequent stage. Each of the subsequent stages converts the analog residue signal from a preceding stage to digital bits and passes its own analog residue signal to the next stage.

U.S. Pat. No. 5,710,563 to Vu et al. discloses a pipelined ADC comprised of a series of 1.5 bit stages, wherein each stage implements a capacitor swapping circuit. The capacitor swapping circuit uses a sampling capacitor (Cs) and an integrating capacitor (Ci) to alternately sample and amplify input signals in order to reduce capacitor mismatches. The teachings of U.S. Pat. No. 5,710,563 are hereby incorporated by reference into the present disclosure as if fully set forth herein.

Although the capacitor swapping circuit disclosed in U.S. Pat. No. 5,710,563 is effective at reducing differential non-linearity in an ADC, this reduction occurs in the region above the upper boundary and below the lower boundary set by the trip points of the ADC. The capacitor swapping circuit in U.S. Pat. No. 5,710,563 does not compensate for the compression or expansion of code widths between the trip points. Thus, significant amounts of differential non-linearity (DNL) and integral non-linearity (INL) may occurs in the region between the trip points of each ADC stage.

There is therefore a need in the art for improved analog-to-digital converters that exhibit less differential non-linearity (DNL) and less integral non-linearity (INL), particularly in the region between the trip points of each ADC stage. In particular, there is a need for analog-to-digital converters that implement capacitor swapping circuits that improve the DNL and INL characteristics of each stage, including in the region between the trip points.

SUMMARY OF THE INVENTION

To address the above-discussed deficiencies of the prior art, it is a primary object of the present invention to provide, for use in an analog to digital (ADC) converter, an ADC stage capable of receiving a differential analog input signal, quantizing the differential analog input signal to a plurality of digital bits, and generating an output residue signal corresponding to a quantization error of the differential analog input signal. In an advantageous embodiment of the present invention, the ADC stage comprises: 1) a differential amplifier having an inverting input and a non-inverting input and a differential output comprising an inverting output and a non-inverting output; 2) a first capacitor having a first side and a second side and a second capacitor having a first side and a second side, wherein the second side of the first capacitor is coupled to the second side of the second capacitor and to the inverting input of the differential amplifier; 3) a third capacitor having a first side and a second side and a fourth capacitor having a first side and a second side, wherein the second side of the third capacitor is coupled to the second side of the fourth capacitor and to the non-inverting input of the differential amplifier; 4) a switch matrix capable of coupling the first sides of the first, second, third and fourth capacitors to selected ones of the first sides of the first, second, third and fourth capacitors, to selected ones of the inverting and non-inverting outputs of the differential amplifiers, and to selected ones of a positive reference voltage and a negative reference voltage; and 5) a switch control logic circuit capable of detecting a zero reference level crossing, wherein a voltage level on a preceding non-inverting output of a preceding ADC stage transitions from below a voltage level on a preceding inverting output of said preceding ADC stage to a voltage level above said voltage level on said preceding inverting output.

According to one embodiment of the present invention, the switch control logic circuit is capable of controlling the switch matrix.

According to another embodiment of the present invention, prior to detection of the zero-reference level crossing, the switch matrix is set such that the first side of the first capacitor is coupled to the non-inverting output, the first side of the fourth capacitor is coupled to the inverting output, and the first side of the second capacitor is coupled to the first side of the third capacitor.

According to still another embodiment of the present invention, the switch control logic circuit, in response to detection of the zero-reference level crossing, modifies the switch matrix such that the first side of the first capacitor is coupled to the first side of the fourth capacitor, the first side of the second capacitor is coupled to the non-inverting output, and the first side of the third capacitor is coupled to the inverting output.

According to yet another embodiment of the present invention, the switch control logic circuit is capable of detecting a negative trip point crossing, wherein a voltage level on the preceding non-inverting output of the differential amplifier transitions from below a negative trip point to above the negative trip point, wherein the negative trip point is below the zero reference level.

According to a further embodiment of the present invention, the switch control logic circuit is capable of modifying the switch matrix in response to detection of the negative trip point crossing.

According to a still further embodiment of the present invention, the switch control logic circuit is capable of detecting a positive trip point crossing, wherein a voltage level on the preceding non-inverting output of the differential amplifier transitions from below a positive trip point to above the positive trip point, wherein the positive trip point is above the zero reference level.

According to a still further embodiment of the present invention, the switch control logic circuit is capable of modifying the switch matrix in response to detection of the positive trip point crossing.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OR THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged pipelined analog-to-digital converter (ADC) architecture.

Figure 1:
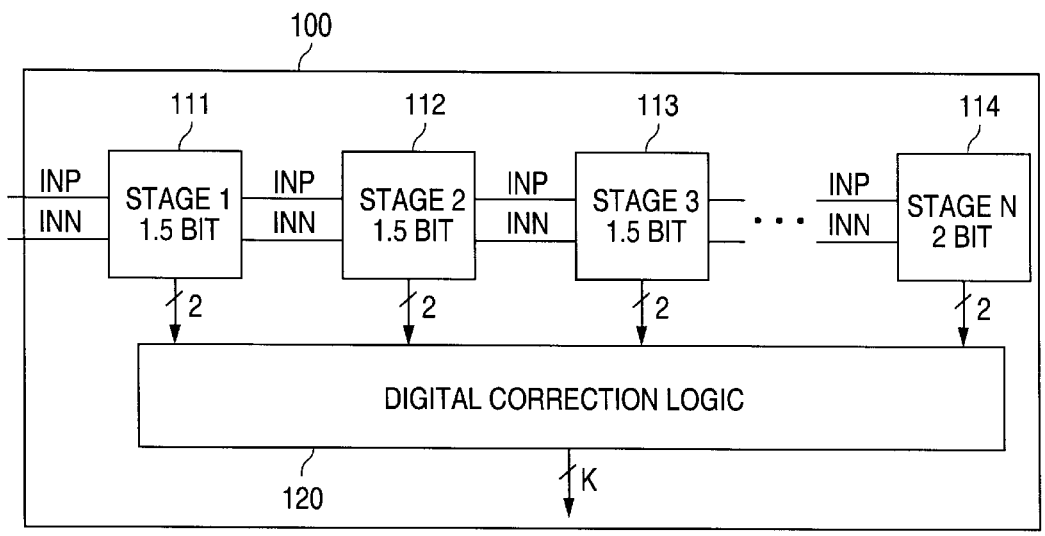
FIG. 1 illustrates an exemplary pipelined analog-to-digital converter (ADC) according to one embodiment of the present invention.

FIG. 1 illustrates exemplary pipelined analog-to-digital converter (ADC) 100 according to one embodiment of the present invention. Pipelined ADC 100 comprises N exemplary ADC stages 111–114, sequentially labeled Stage 1, Stage 2, Stage 3 and Stage N. The first N-1 stages (including ADC stages 111–113) are 1.5 bit ADC stages and the last stage (ADC stage 114) is a 2-bit ADC stage. ADC stage 111 receives a differential analog input signal comprising a positive differential input (INP) and a negative differential input (INN). ADC stage 111 converts the differential input signal to a 1.5 bit digital output signal, calculates the quantization error, and converts the quantization error to a differential analog output residue signal. The 1.5 bit digital output signal is transmitted as two digital bits to digital correction logic 120.

Except for ADC stage 114, every subsequent ADC stage receives the differential analog output residue signal from the preceding ADC stage as its own differential input (INP, INN), converts the differential input signal to a 1.5 bit digital output signal that is transmitted as two digital bits to digital correction logic 120. Each subsequent ADC stage also calculates the quantization error and converts the quantization error to a differential analog output residue signal. Digital correction logic 120 removes a redundancy in each stage bit resolution that partially contributes to the K-bit digital output signal according to algorithms well-known to those skilled in the art.

Figure 2:
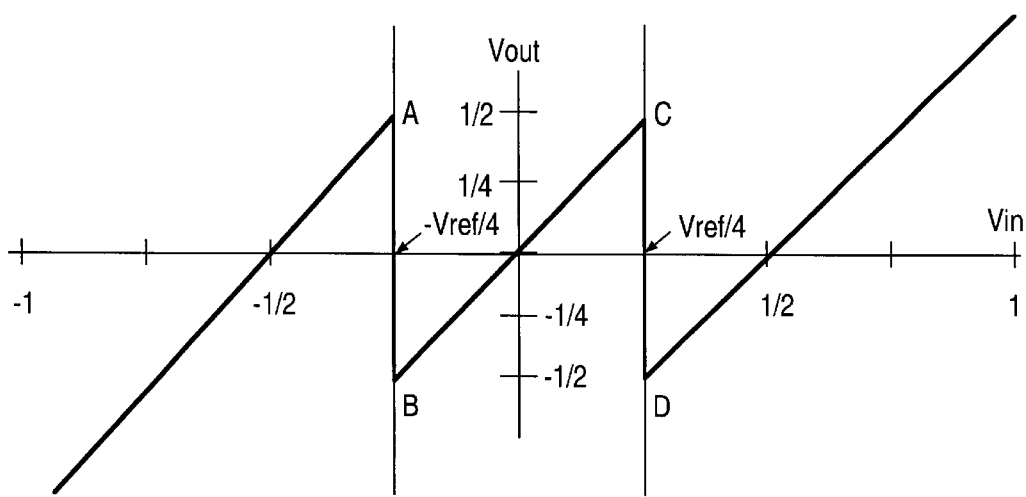
FIG. 2 illustrates the ideal output function of the pipelined ADC in FIG. 1 according to one embodiment of the present invention.

FIG. 2 illustrates the ideal output function of exemplary ADC stage 111 in pipelined ADC 100 according to one embodiment of the present invention. The output signal (Vout=the differential residual signal) of each stage continually increases as the input signal (Vin=INP-INN) of each stage increases from a negative reference level, −Vref. At residue corner point A, Vin crosses a first trip point, referred to hereafter as −Vtrip). As will be described below in greater detail, when Vin crosses −Vtrip, changes in the switch positions in ADC stage 111 cause Vout to drop to residue corner point B. Thereafter, Vout continues to increase until, at residue corner point C, Vin crosses a second trip point, referred to hereafter as +Vtrip). When Vin crosses +Vtrip, additional changes in the switch positions in ADC stage 111 cause Vout to drop to residue corner point D before continuing to rise again.

Traditional capacitor swapping circuits, such as those disclosed in U.S. Pat. No. 5,710,563, incorporated by reference above, adjusts the residue corner points A, B, C and D so that A-B and C-D is closer to the value of Vref than without capacitor swapping. The present invention improves upon conventional capacitor swapping circuits by making the value C-B closer to the ideal value of Vref as well. The present invention does this by placing a new trip point at the zero crossing. A zero crossing detector circuit causes capacitor swapping to occur when the new trip point at zero is crossed.

With the new configuration, the residue at the corner points A, B, C, and D from each ADC stage is generated under the gain conditions set forth in TABLE 1 below.

TABLE 1

|   | | Zero-Crossing Cap Swapping | Traditional Cap Swapping |
|---|---|---|---|
| A | Vin < − Vtrip | Vin[(C2 + C1)/C1] + Vref(C2/C1) | Vin[(C2 + C1)/C1] + Vref(C2/C1) |
| B | 0 > Vin > − Vtrip | Vin[(C2 + C1)/C2] | Vin[(C2 + C1)/C2] |
| C | 0 < Vin < + Vtrip | Vin[(C2 + C1)/C1] | Vin[(C2 + C1)/C2] |
| D | Vin > + Vtrip | Vin[(C2 + C1)/C2] − Vref(C2/C1) | Vin[(C2 + C1)/C1] − Vref(C2/C1) |

The capacitors C1 and C2 are designed to be matched to the same value with no error. However, when producing the physical silicon circuit, there frequently is an error in size between the two that can be expressed as C1=C(1+α) and C2=C(1−α). If these error values are substituted into the equations for corner points A, B, C, and D, the values in TABLE 2 below are obtained.

TABLE 2

|   | | Zero-Crossing Cap Swapping | Traditional Cap Swapping |
|---|---|---|---|
| A | Vin < − Vtrip | Vref[(2 − 4α)/(4 + 4α)] | Vref[(2 − 4α)/(4 + 4α)] |
| B | 0 > Vin > − Vtrip | −Vtrip[2/(1 − α)] | −Vtrip[2/(1 − α)] |
| C | 0 < Vin < + Vtrip | Vtrip[2/(1 + α)] | Vtrip[2/(1 − α)] |
| D | Vin > + Vtrip | Vref[(−2 − 4α)/(4 − 4α)] | Vref[(−2 + 4α)/(4 + 4α)] |

The residue errors for both cases are found by calculating the terms C-D, A-B, and C-B, as shown in TABLE 3 below. In theory, all residue errors should be equal to Vref.

TABLE 3

|   | Zero-Crossing Cap Swapping | Traditional Cap Swapping |
|---|---|---|
| A-B | Vref(1 − α) | Vref(1 − α) |
| C-D | Vref(1 + α) | Vref(1 − α) |
| C-B | Vref(1 + α$^2$) | Vref(1 + α) |

As TABLE 3 shows, the zero-crossing cap swapping scheme has the same relative error in both the A-B and C-D cases as the traditional cap swapping scheme. However, the zero-crossing cap swapping scheme improves the error in the C-B cases by the squared factor of α.

Figure 3:
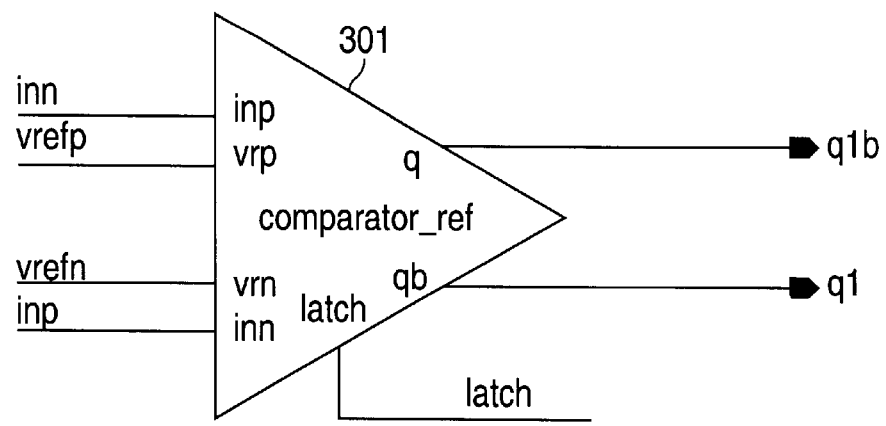
FIG. 3 illustrates a selected portion of an exemplary 1.5 bit stage in the pipelined ADC according to one embodiment of the present invention.
Figure 3:
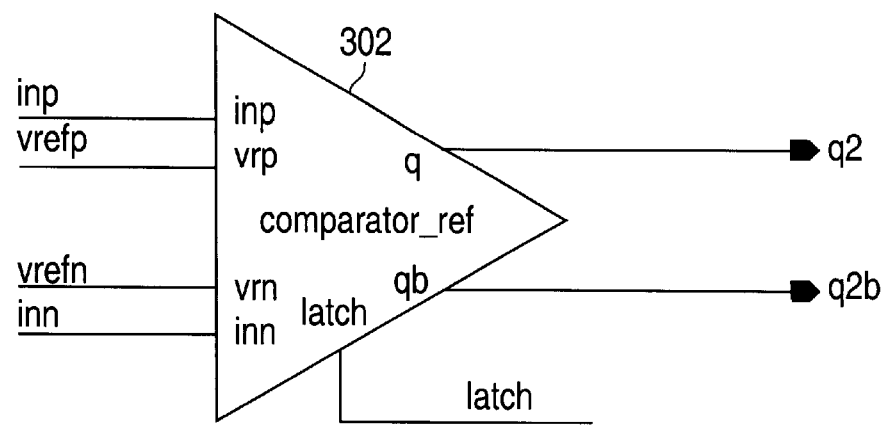
Figure 3:
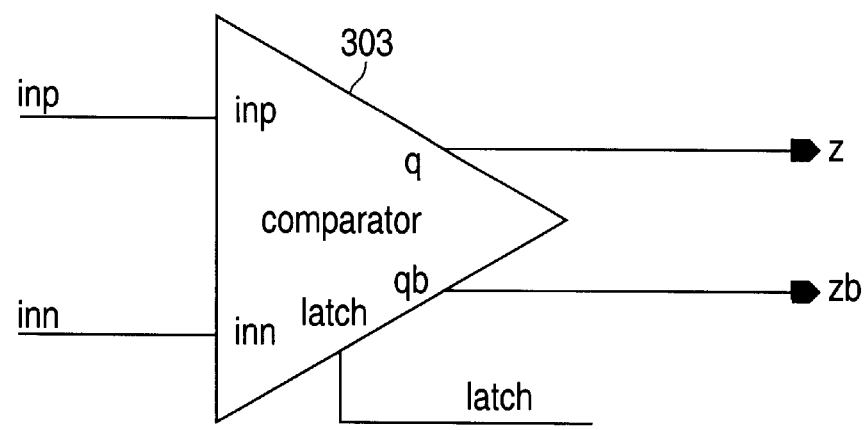

FIG. 3 illustrates a selected portion of exemplary 1.5 bit stage 111 in pipelined ADC 100 according to one embodiment of the present invention. FIG. 3 illustrates comparators 301, 302 and 303 that generate the two digital bits that are transferred from each 1.5 bit ADC stage to digital correction logic 120. Comparator 301 receives the differential analog input signal, INN and INP, and the positive and negative reference signals, Vrefp and Vrefn, respectively. The negative differential input signal, INN, is coupled to the positive input (inp) of comparator 301. The positive differential input signal, INP, is coupled to the negative input (inn) of comparator 301. This is an inverting configuration. The differential output of comparator 301 is a first differential digital data bit (outputs q1 and q1b).

Comparator 302 receives the differential analog input signal, INN and INP, and the positive and negative reference signals, Vrefp and Vrefn, respectively. The negative differential analog input signal, INN, is coupled to the negative input (inn) of comparator 302. The positive differential analog input signal, INP, is coupled to the positive input (inp) of comparator 302. This is a non-inverting configuration. The differential output of comparator 302 is a second differential digital data bit (outputs q1 and q1b).

Finally, comparator 303 is a zero crossing detector that detects when the differential analog input signal (INP, INN) crosses the zero reference level. The positive differential analog input signal INP is coupled to the positive input (inp) of comparator 303 and the negative differential analog input signal, INN, is coupled to the negative input (inn) of comparator 303. This is a non-inverting configuration. When INP is higher than INN, the positive differential output, Z, of comparator 303 is high with respect to the negative differential output, Zb. When INP is lower than INN, the positive differential output, Z, of comparator 303 is low with respect to the negative differential output, Zb.

TABLE 4 below illustrates the operation of comparators 301–303 in ADC stage 111.

TABLE 4

| Vin | q1 | q2 | Z |
|---|---|---|---|
| −Vtrip > Vin | Low | Low | Low |
| −Vtrip < Vin < −Vtrip; and Vin < 0 | Low | High | Low |
| −Vtrip < Vin < −Vtrip; and Vin > 0 | Low | High | High |
| Vtrip < Vin | High | High | High |

The two bits, q1 and q2, that form the 1.5 bit output of ADC stage 111 can only take on the values 00, 01, and 11. The zero detect bit, Z, is low whenever Vin is less than zero and is high whenever Vin is greater than zero.

Figure 4:
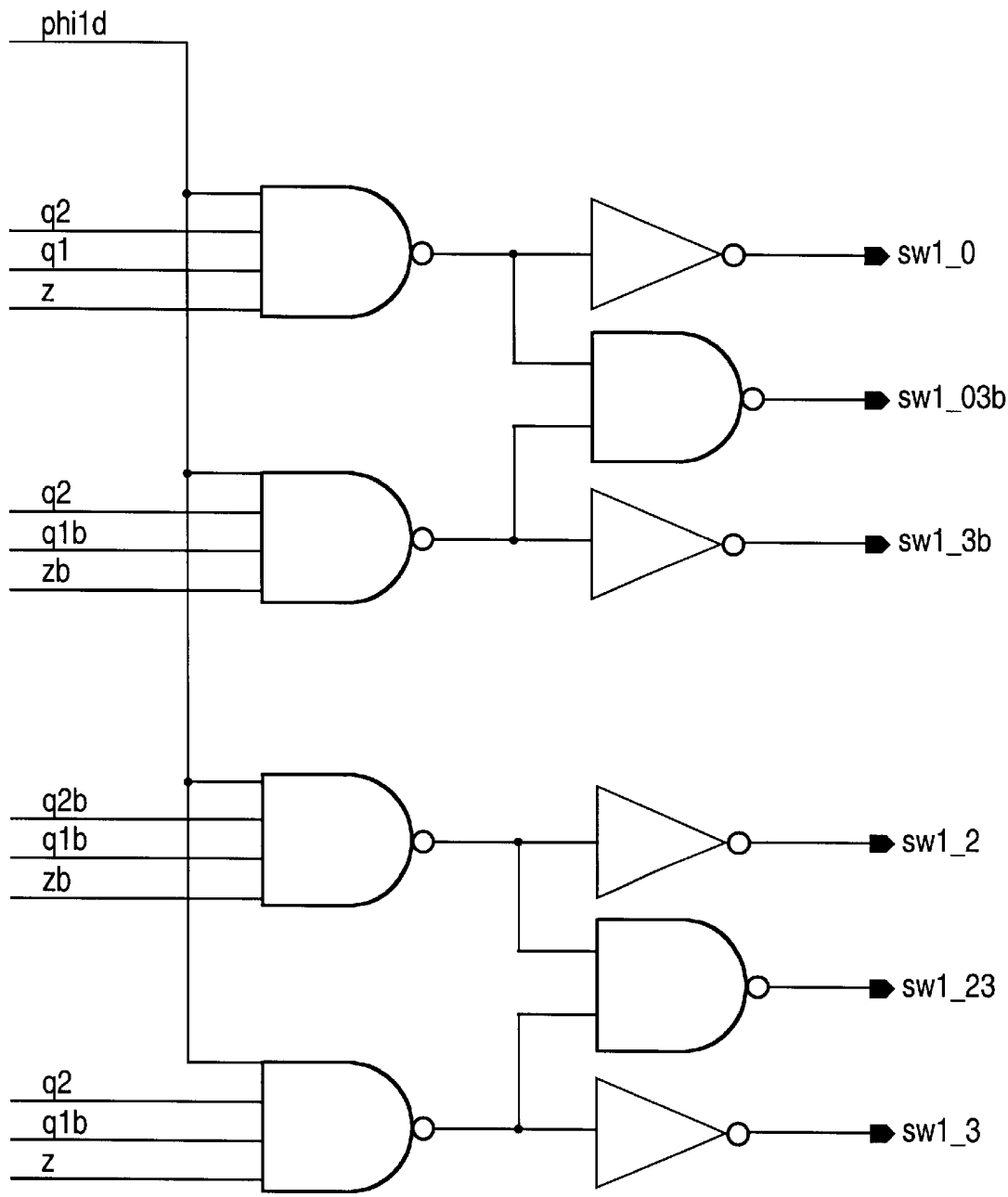
FIG. 4 illustrates logic circuitry that generates the switch control signals that drive the switch architecture in the 1.5 bit stage according to one embodiment of the present invention.

FIG. 4 illustrates logic circuitry that generates the switch control signals that drive the switch architecture in 1.5 bit stage 111 according to one embodiment of the present invention. The logic circuitry comprises six NAND gates and four inverters that receive the input signals q1, q1b, q2, q2b, z, and zb, from comparators 303–303, and the clock signal, phi 1d. The logic circuitry generates the switch control signals, sw1_0, sw1_03b, sw1_3b, sw1_2, sw1_23, and sw1_3.

Figure 5:
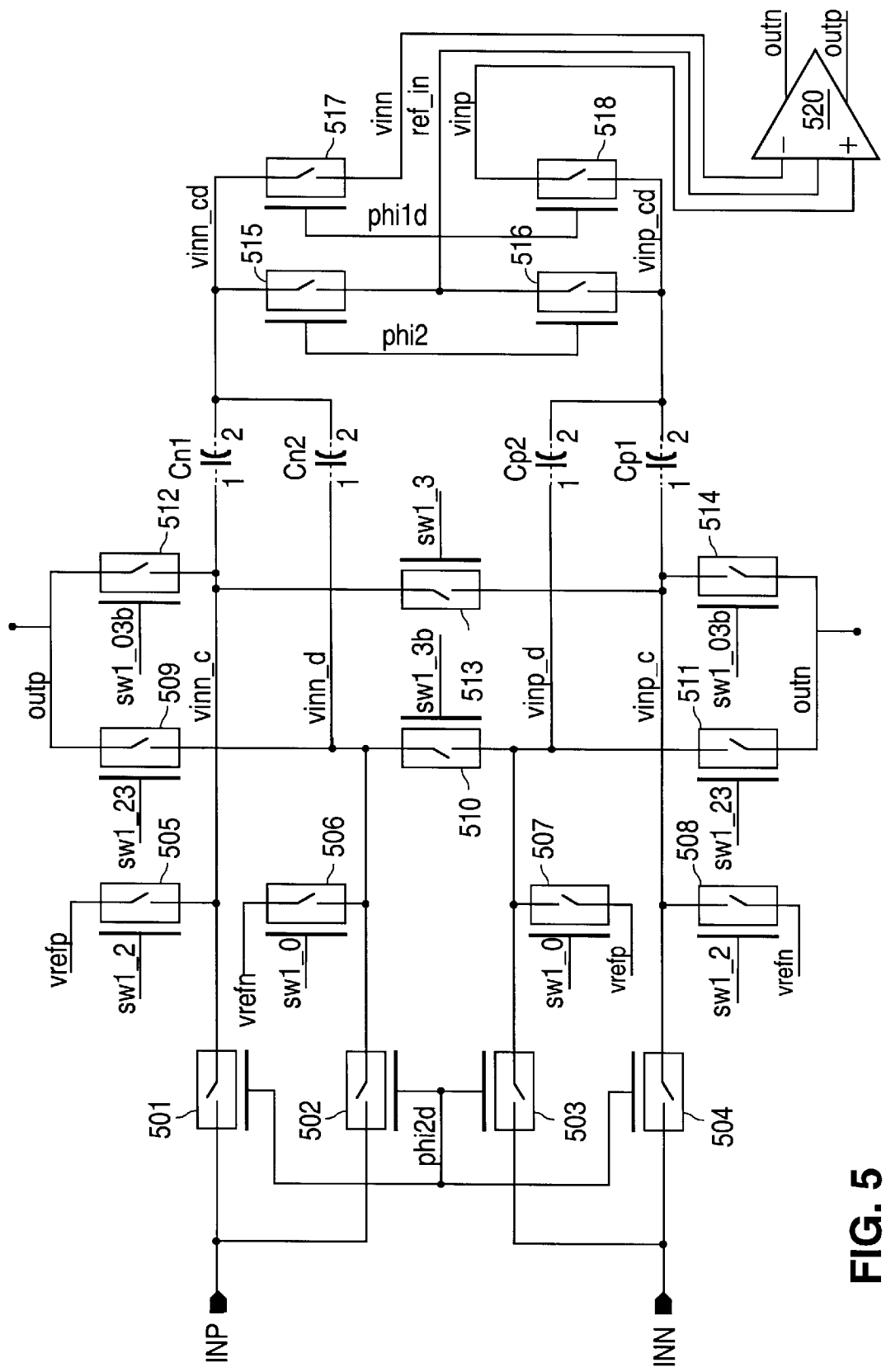
FIG. 5 illustrates the switch architecture and differential amplifier used to generate the differential output signal of the exemplary 1.5 bit stage according to one embodiment of the present invention.

FIG. 5 illustrates the switch architecture and differential amplifier 520 used to generate the differential output signal of exemplary 1.5 bit ADC stage 111 according to one embodiment of the present invention. The switching architecture comprises switches 501–518, which selectively couple the common (i.e. connected) sides (Cn1-2 and Cn2-2) of capacitors Cn1 and Cn2 to the negative (i.e., inverting) input Vinn of differential amplifier 520 and which selectively couple the common sides (Cp1-2 and Cp2-2) of capacitors Cp1 and Cp2 to the positive (i.e., non-inverting) input Vinp of differential amplifier 520. Switches 501–508 also selectively couple the other sides (i.e., Cn1-1, Cn2-1, Cp1-1, Cp2-1) of capacitors Cn1, Cn2, Cp1 and Cp2 to the differential input signals INP and INN and to the differential output signals OUTP and OUTN of ADC stage 111, as well as to the positive and negative reference voltages, Vrefp and Vrefn.

ADC stage 111 operates in sample and hold phases. During the sampling phase, the inputs to ADC stage 111, INP and INN, are sampled onto capacitors. During hold (or amplification) phase, the sampled voltage is converted to 1.5 bit digital format and an error (or restore) signal is generated on the OUTN and OUTP outputs. TABLE 5 below illustrates the operation of the switch control signals sw1_2, sw1_0 and sw1_23 in ADC stage 111 during the sampling phase.

TABLE 5

| Vin | sw1_2 | sw1_0 | sw1_23 |
|---|---|---|---|
| −Vtrip > Vin | off | off | off |
| −Vtrip < Vin < −Vtrip; and Vin < 0 | off | off | off |
| −Vtrip < Vin < −Vtrip; and Vin > 0 | off | off | off |
| Vtrip < Vin | off | off | off |

TABLE 6 below illustrates the operation of the switch control signals sw1_03b, sw1_3 and sw1_3b in ADC stage 111 during the sampling phase.

TABLE 6

| Vin | sw1_03b | sw1_3 | sw1_3b |
|---|---|---|---|
| −Vtrip > Vin | off | off | off |
| −Vtrip < Vin < −Vtrip; and Vin < 0 | off | off | off |
| −Vtrip < Vin < −Vtrip; and Vin > 0 | off | off | off |
| Vtrip < Vin | off | off | off |

TABLE 7 below illustrates the operation of the switch control signals phi 2d, phi 2, and phi 1d in ADC stage 111 during the sampling phase.

TABLE 7

| Vin | phi 2d | phi 2 | phi 1d |
|---|---|---|---|
| −Vtrip > Vin | on | on | off |
| −Vtrip < Vin < −Vtrip; and Vin < 0 | on | on | off |
| −Vtrip < Vin < −Vtrip; and Vin > 0 | on | on | off |
| Vtrip < Vin | on | on | off |

As TABLES 5–7 above illustrate, during the sampling phase, for all value of Vin, all of switches 505–514 and switches 517–518 are open-circuited (OFF) and switches 501–504 are closed by the clock signal phi 2d and switches 515 and 516 are closed by the clock signal phi 2. During the sampling phase, the input signal INP is coupled to Cn1-1 and Cn2-1, the input signal INN is coupled to Cp1-1 and Cp2-1, the common sides (Cn1-2, Cn2-2) of Cn1 and Cn2 are coupled to the inverting input Vinn of differential amplifier 520, and the common sides (Cp1-2, Cp2-2) of Cp1 and Cp2 are coupled to the non-inverting input Vinp of differential amplifier 520. After capacitors Cn1, Cn1, Cp1 and Cp2 are charged up during the sampling phase, the hold (or amplification) phase begins.

TABLE 8 below illustrates the operation of the switch control signals sw1_2, sw1_0 and sw1_23 in ADC stage 111 during the hold (amplification) phase.

TABLE 8

| Vin | sw1_2 | sw1_0 | sw1_23 |
|---|---|---|---|
| −Vtrip > Vin | on | off | on |
| −Vtrip < Vin < −Vtrip; and Vin < 0 | off | off | off |
| −Vtrip < Vin < −Vtrip; and Vin > 0 | off | off | on |
| Vtrip < Vin | off | on | off |

TABLE 9 below illustrates the operation of switch control signals sw1_03b, sw1_3 and sw1_3b in ADC stage 111 during the hold (amplification) phase.

TABLE 9

| Vin | sw1_03b | sw1_3 | sw1_3b |
|---|---|---|---|
| −Vtrip > Vin | off | off | off |
| −Vtrip < Vin < −Vtrip; and Vin < 0 | on | off | on |
| −Vtrip < Vin < −Vtrip; and Vin > 0 | off | on | off |
| Vtrip < Vin | on | off | off |

TABLE 10 below illustrates the operation of the switch control signals phi 2d, phi 2, and phi 1d in ADC stage 111 during the hold (amplification) phase.

TABLE 10

| Vin | phi 2d | phi 2 | phi 1d |
|---|---|---|---|
| −Vtrip > Vin | off | off | on |
| −Vtrip < Vin < −Vtrip; and Vin < 0 | off | off | on |
| −Vtrip < Vin < −Vtrip; and Vin > 0 | off | off | on |
| Vtrip < Vin | off | off | on |

As TABLES 8–10 show, when Vin is less than −Vtrip (referred to as Phase 1), switches 505 and 508 are closed by the switch control signal sw1_2, switches 517 and 518 are closed by switch control signal phi 1d, switches 509 and 511 are closed by switch control signal sw1_23, and all other switches are open. At this point, Cp1-1 is coupled to Vrefn, Cn1-1 is coupled to Vrefp, the common sides Cp1-2 and Cp2-2 are coupled to Vinp of amplifier 520, the common sides Cn1-2 and Cn2-2 are coupled to Vinn of amplifier 520, Cn2-1 is coupled in a feedback arrangement to the output OUTP of amplifier 520, and Cp2-1 is coupled in a feedback arrangement to the output OUTN of amplifier 520.

As TABLES 8–10 show, when Vin is greater than −Vtrip but less than 0 (referred to as Phase 2), switches 512 and 514 are closed by the switch control signal sw1_03b, switches 517 and 518 are closed by switch control signal phi 1d, switch 510 is closed by switch control signal sw1_3b, and all other switches are open. At this point, Cp1-1 is coupled to the output OUTN, Cn1-1 is coupled to the output OUTP, the common sides Cp1-2 and Cp2-2 are coupled to Vinp of amplifier 520, the common sides Cn1-2 and Cn2-2 are coupled to Vinn of amplifier 520, and Cn2-1 is coupled to Cp2-1 through switch 510.

As TABLES 8 and 9 above indicate, when the signal Vin is greater than 0 but less than +Vtrip (i.e., Vin crosses the zero reference level between −Vtrip and +Vtrip) (referred to as Phase 3l ), the switch control signal SW1 23 switches from OFF to ON, the switch control signal sw1_03b switches from ON to OFF, the switch control signal sw1_3 switches from OFF to ON, and the switch control signal sw1_b3 switches from ON to OFF. At this point, Cp2-1 is coupled to the output OUTN, Cn2-1 is coupled to the output OUTP, the common sides Cp1-2 and Cp2-2 are coupled to Vinp of amplifier 520, the common sides Cn1-2 and Cn2-2 are coupled to Vinn of amplifier 520, and Cn1-1 is coupled to Cp1-1 through switch 513. This accomplishes the gain functions and improved residue error set forth in TABLES 1–3 above for the zero-crossing capacitor technique according to the principles of the present invention.

As TABLES 8–10 show, when Vin is greater than +Vtrip (referred to as Phase 4), switches 506 and 507 are closed by the switch control signal sw1_0, switches 517 and 518 are closed by switch control signal phi 1d, switches 509 and 511 are closed by switch control signal sw1_23, switches 512 and 514 are closed by switch control signal sw1_03b, and all other switches are open. At this point, Cn1-1 is coupled to the output OUTP, Cp1-1 is coupled to the output OUTN, the common sides Cp1-2 and Cp2-2 are coupled to Vinp of amplifier 520, the common sides Cn1-2 and Cn2-2 are coupled to Vinn of amplifier 520, Cn2-1 is coupled to Vrefn, and Cp2-1 is to Vrefn.

Although the present invention has been described in detail, those skilled in the art should understand that they can make various changes, substitutions and alterations herein without departing from the spirit and scope of the invention in its broadest form.

What is claimed is:

1. For use in an analog-to-digital converter (ADC), an ADC stage capable of receiving a differential analog input signal, quantizing said differential analog input signal to a plurality of digital bits, and generating an output residue signal corresponding to a quantization error of said differential analog input signal, said ADC stage comprising:

a differential amplifier having an inverting input and a non-inverting input and a differential output comprising an inverting output and a non-inverting output;

a first capacitor having a first side and a second side and a second capacitor having a first side and a second side, wherein said second side of said first capacitor is coupled to said second side of said second capacitor and to said inverting input of said differential amplifier;

a third capacitor having a first side and a second side and a fourth capacitor having a first side and a second side, wherein said second side of said third capacitor is coupled to said second side of said fourth capacitor and to said non-inverting input of said differential amplifier;

a switch matrix capable of coupling said first sides of said first, second, third and fourth capacitors to selected ones of said first sides of said first, second, third and fourth capacitors, to selected ones of said inverting and non-inverting outputs of said differential amplifiers, and to selected ones of a positive reference voltage and a negative reference voltage; and a switch control logic circuit capable of detecting a zero reference level crossing, wherein a voltage level on a preceding non-inverting output of a preceding ADC stage transitions from below a voltage level on a preceding inverting output of said preceding ADC stage to a voltage level above said voltage level on said preceding inverting output.

2. The ADC stage as set forth in claim 1 wherein said switch control logic circuit is capable of controlling said switch matrix.

3. The ADC stage as set forth in claim 2 wherein, prior to detection of said zero-reference level crossing, said switch matrix is set such that said first side of said first capacitor is coupled to said non-inverting output, said first side of said fourth capacitor is coupled to said inverting output, and said first side of said second capacitor is coupled to said first side of said third capacitor.

4. The ADC stage as set forth in claim 3 wherein said switch control logic circuit, in response to detection of said zero-reference level crossing, modifies said switch matrix such that said first side of said first capacitor is coupled to said first side of said fourth capacitor, said first side of said second capacitor is coupled to said non-inverting output, and said first side of said third capacitor is coupled to said inverting output.

5. The ADC stage as set forth in claim 4 wherein said switch control logic circuit is capable of detecting a negative trip point crossing, wherein a voltage level on said preceding non-inverting output transitions from below a negative trip point to above said negative trip point, wherein said negative trip point is below said zero reference level.

6. The ADC stage as set forth in claim 5 wherein said switch control logic circuit is capable of modifying said switch matrix in response to detection of said negative trip point crossing.

7. The ADC stage as set forth in claim 6 wherein said switch control logic circuit is capable of detecting a positive trip point crossing, wherein a voltage level on said preceding non-inverting output transitions from below a positive trip point to above said positive trip point, wherein said positive trip point is above said zero reference level.

8. The ADC stage as set forth in claim 7 wherein said switch control logic circuit is capable of modifying said switch matrix in response to detection of said positive trip point crossing.

9. An analog-to-digital converter (ADC) comprising a plurality of ADC stages, at least one of said ADC stages capable of receiving a differential analog input signal, quantizing said differential analog input signal to a plurality of digital bits, and generating an output residue signal corresponding to a quantization error of said differential analog input signal, said at least one ADC stage comprising:

a differential amplifier having an inverting input and a non-inverting input and a differential output comprising an inverting output and a non-inverting output;

a first capacitor having a first side and a second side and a second capacitor having a first side and a second side, wherein said second side of said first capacitor is coupled to said second side of said second capacitor and to said inverting input of said differential amplifier;

a third capacitor having a first side and a second side and a fourth capacitor having a first side and a second side, wherein said second side of said third capacitor is coupled to said second side of said fourth capacitor and to said non-inverting input of said differential amplifier;

a switch matrix capable of coupling said first sides of said first, second, third and fourth capacitors to selected ones of said first sides of said first, second, third and fourth capacitors, to selected ones of said inverting and non-inverting outputs of said differential amplifiers, and to selected ones of a positive reference voltage and a negative reference voltage; and a switch control logic circuit capable of detecting a zero reference level crossing, wherein a voltage level on a preceding non-inverting output of a preceding ADC stage transitions from below a voltage level on a preceding inverting output of said preceding ADC stage to a voltage level above said voltage level on said preceding inverting output.

10. The analog-to-digital converter as set forth in claim 9 wherein said switch control logic circuit is capable of controlling said switch matrix.

11. The analog-to-digital converter as set forth in claim 10 wherein, prior to detection of said zero-reference level crossing, said switch matrix is set such that said first side of said first capacitor is coupled to said non-inverting output, said first side of said fourth capacitor is coupled to said inverting output, and said first side of said second capacitor is coupled to said first side of said third capacitor.

12. The analog-to-digital converter as set forth in claim 11 wherein said switch control logic circuit, in response to detection of said zero-reference level crossing, modifies said switch matrix such that said first side of said first capacitor is coupled to said first side of said fourth capacitor, said first side of said second capacitor is coupled to said non-inverting output, and said first side of said third capacitor is coupled to said inverting output.

13. The analog-to-digital converter as set forth in claim 12 wherein said switch control logic circuit is capable of detecting a negative trip point crossing, wherein a voltage level on said preceding non-inverting output transitions from below a negative trip point to above said negative trip point, wherein said negative trip point is below said zero reference level.

14. The analog-to-digital converter as set forth in claim 13 wherein said switch control logic circuit is capable of modifying said switch matrix in response to detection of said negative trip point crossing.

15. The analog-to-digital converter as set forth in claim 14 wherein said switch control logic circuit is capable of detecting a positive trip point crossing, wherein a voltage level on said preceding non-inverting output transitions from below a positive trip point to above said positive trip point, wherein said positive trip point is above said zero reference level.

16. The analog-to-digital converter as set forth in claim 15 wherein said switch control logic circuit is capable of modifying said switch matrix in response to detection of said positive trip point crossing.

17. A method for use in an analog-to-digital converter (ADC) comprising an ADC stage capable of receiving a differential analog input signal, quantizing the differential analog input signal to a plurality of digital bits, and generating an output residue signal corresponding to a quantization error of the differential analog input signal, the ADC stage comprising: 1) a differential amplifier having an inverting input and a non-inverting input and a differential output comprising an inverting output and a non-inverting output; 2) a first capacitor having a first side and a second side and a second capacitor having a first side and a second side, wherein the second side of the first capacitor is coupled to the second side of the second capacitor and to the inverting input of the differential amplifier; 3) a third capacitor having a first side and a second side and a fourth capacitor having a first side and a second side, wherein the second side of the third capacitor is coupled to the second side of the fourth capacitor and to the non-inverting input of the differential amplifier; 4) a switch matrix capable of coupling the first sides of the first, second, third and fourth capacitors to selected ones of the first sides of the first, second, third and fourth capacitors, to selected ones of the inverting and non-inverting outputs of the differential amplifiers, and to selected ones of a positive reference voltage and a negative reference voltage, the method comprising the steps of:

detecting a zero reference level crossing, wherein a voltage level on a preceding non-inverting output of a preceding ADC stage transitions from below a voltage level on a preceding inverting output of a preceding ADC stage to a voltage level above the voltage level on the preceding inverting output;

in response to detection of the zero-reference level crossing, modifying the switch matrix from a first state to a second state.

18. The method as set forth in claim 17 wherein in the first state, prior to detection of the zero-reference level crossing, the switch matrix is set such that the first side of the first capacitor is coupled to the non-inverting output, the first side of the fourth capacitor is coupled to the inverting output, and the first side of the second capacitor is coupled to the first side of the third capacitor.

19. The method as set forth in claim 18 wherein in the second state, in response to detection of the zero-reference level crossing, the switch matrix is set such that the first side of the first capacitor is coupled to the first side of the fourth capacitor, the first side of the second capacitor is coupled to the non-inverting output, and the first side of the third capacitor is coupled to the inverting output.

20. The method as set forth in claim 19 further comprising the steps of detecting a negative trip point crossing, wherein a voltage level on the preceding non-inverting output transitions from below a negative trip point to above the negative trip point, wherein the negative trip point is below the zero reference level.

21. The method as set forth in claim 20 further comprising the step of modifying the switch matrix in response to detection of the negative trip point crossing.

22. The method as set forth in claim 21 further comprising the step of detecting a positive trip point crossing, wherein a voltage level on the preceding non-inverting output transitions from below a positive trip point to above the positive trip point, wherein the positive trip point is above the zero reference level.

23. The method as set forth in claim 22 further comprising the step of modifying the switch matrix in response to detection of the positive trip point crossing.

* * * * *

UNITED STATES PATENT AND TRADEMARK OFFICE
CERTIFICATE OF CORRECTION

PATENT NO. : 6,469,652 B1
DATED : October 22, 2002
INVENTOR(S) : Arlo J. Aude

It is certified that error appears in the above-identified patent and that said Letters Patent is hereby corrected as shown below:

Column 8,
Line 49, delete "31" and insert -- 3 --.

Signed and Sealed this

Twenty-fifth Day of January, 2005

JON W. DUDAS
*Director of the United States Patent and Trademark Office*